(12) United States Patent
Rasmussen

(10) Patent No.: US 7,544,986 B2
(45) Date of Patent: Jun. 9, 2009

(54) SYSTEM INCLUDING INTEGRATED CIRCUIT STRUCTURES FORMED IN A SILICONE LADDER POLYMER LAYER

(75) Inventor: Robert Rasmussen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 214 days.

(21) Appl. No.: 10/899,011

(22) Filed: Jul. 27, 2004

(65) Prior Publication Data
US 2004/0262658 A1 Dec. 30, 2004

Related U.S. Application Data

(62) Division of application No. 10/101,750, filed on Mar. 21, 2002, now Pat. No. 7,091,131.

(51) Int. Cl.
H01L 29/92 (2006.01)
(52) U.S. Cl. .................. 257/306; 257/750; 257/751
(58) Field of Classification Search .......... 257/303, 257/306, 751–753
See application file for complete search history.

(56) References Cited

U.S. PATENT DOCUMENTS

| 5,180,691 | A | 1/1993 | Adachi et al. |
| 5,198,520 | A | 3/1993 | Onishi et al. |
| 5,278,451 | A | 1/1994 | Adachi et al. |
| 5,600,151 | A | 2/1997 | Adachi et al. |
| 5,889,330 | A | 3/1999 | Nishimura et al. |
| 6,096,595 | A | 8/2000 | Huang |
| 6,274,424 | B1* | 8/2001 | White et al. ............. 438/239 |
| 6,291,250 | B1* | 9/2001 | Igarashi ...................... 438/3 |
| 6,323,125 | B1 | 11/2001 | Soo et al. |
| 6,387,750 | B1 | 5/2002 | Lai et al. |
| 6,424,041 | B1* | 7/2002 | Oashi et al. ............ 257/751 |
| 6,468,858 | B1* | 10/2002 | Lou ........................ 438/253 |
| 6,534,809 | B2* | 3/2003 | Moise et al. ............ 257/295 |
| 6,559,499 | B1 | 5/2003 | Alers et al. |
| 6,617,631 | B2* | 9/2003 | Huang ................... 257/296 |
| 6,661,051 | B1* | 12/2003 | Durcan et al. .......... 257/306 |
| 6,764,945 | B2* | 7/2004 | Ashihara et al. ........ 438/637 |

FOREIGN PATENT DOCUMENTS

JP 2000136223 A * 5/2000

OTHER PUBLICATIONS

English translation of JP 2000-136223 (May 2000).*
Yasuda et al., "Photocrosslinking Reactoin of Vinyl-Functional Polyphenylsilsesquioxane Sensitized with Aromatic Bisazide Compounds", Journal of Polymer Science: Part A: Polymer Chemistry, vol. 39, 4196-4205, (2001).*

* cited by examiner

*Primary Examiner*—Allan R. Wilson
(74) *Attorney, Agent, or Firm*—Dickstein Shapiro LLP

(57) ABSTRACT

A method of forming integrated circuit structures, such as capacitors and conductive plugs, within contact openings formed in a photosensitive silicone ladder polymer (PVSQ) is disclosed. Contact openings with reduced striations and CD loss are formed in a photosensitive silicone ladder polymer (PVSQ) layer by patterning the PVSQ film employing a photomask with a predefined pattern, exposing the PVSQ film to i-line, developing the exposed PVSQ film in a mixture of anisole/xylene in a ratio of about 1:2 for about 30 seconds, and subsequently optionally annealing the undeveloped PVSQ film at a temperature of about 300° C. to about 600° C.

14 Claims, 8 Drawing Sheets

SYSTEM INCLUDING INTEGRATED CIRCUIT STRUCTURES FORMED IN A SILICONE LADDER POLYMER LAYER

CROSS REFERENCE TO RELATED APPLICATIONS

The present application is a divisional of U.S. application Ser. No. 10/101,750, filed on Mar. 21, 2002, now U.S. Pat. No. 7,091,131 the disclosure of which is herewith incorporated by reference in its entirety.

FIELD OF THE INVENTION

The present invention relates to the field of semiconductor integrated circuits and, in particular, to a novel method of forming contact openings and respective integrated circuit structures in a photosensitive silicone ladder polymer insulating layer.

BACKGROUND OF THE INVENTION

Semiconductor integrated circuits with high device density require the patterning of closely spaced submicrometer lines in semiconductors materials to form submicron geometries such as small area emitters for bipolar transistors, short gates for field effect transistors and narrow interconnection lines between devices. The formation of such polysilicon, metal or insulator structures typically requires definition of the locations of such structures in a layer of photoresist, which in turn is formed on a layer of conductor or insulator to be etched. The definition of the location of such structures is accomplished by exposing the photoresist to light passing through a reticle or photomask which contains the desired pattern. After exposure and treatment of the photoresist, the underlying layer is plasma etched using the patterned photoresist as a template. Subsequent processing steps are determined according to the type of device to be fabricated.

As advances in photolithographic and processing capabilities progressively increase, the lateral dimensions of features in silicon integrated circuits continue to decrease. Fabrication of reduced device geometries in integrated circuits mandates minute contact holes of submicron size within insulation layers and minimum isolation distance requirements measured in terms of critical dimensions (CD). For example, recent generations of complementary metal-oxide silicon integrated circuits (CMOS) have gate regions with dimensions on the order of 0.25 microns, and will have dimensions on the order of 0.18 microns and less in the near future.

During photolithography, problems arise because high resolution submicrometer images in photoresist require shallow depth of focus during exposure, but thick photoresist patterns are required because of the poor etch rate between the photoresist and the underlying semiconductor layer. During this process, the substrate is exposed to ion and electron bombardment, UV light, X-rays, and scattered radiations. As a consequence, irregular topographies, distorted images, large striations and uncontrolled increases in the size of the contact openings or holes, known as CD losses, occur during the exposure of the photoresist layer.

Irregular topographies and CD loss also occur as a result of the plasma etch attacking the side walls of the contact opening. When two discontinuities are formed in adjacent contact openings, the integrated circuit suffers a loss in critical dimension (CD loss), which is critical especially in the sub-quarter micron regime. As a result of the irregular contact openings, an unwanted and uncontrolled increase in the diameter of the contact openings may also result. This increased size also impacts the displacement of the metal atoms that fill the contact openings. Thus, in addition to the loss in critical dimension, electrical contacts may also become unreliable.

Accordingly, there is a need for an improved method of forming contact openings without a reduction in the critical dimension and without striations formed in the sidewalls of such contact openings. There is further a need for an improved method of forming contact openings which employs fewer and simpler processing steps.

BRIEF SUMMARY OF THE INVENTION

The present invention provides a method of forming integrated circuit structures, such as capacitors, conductive plugs and other structures, formed within contact openings of a photosensitive silicone ladder polymer (PVSQ). The present invention further provides a method of forming a contact opening in a layer of photosensitive silicone ladder polymer (PVSQ) with reduced striations and CD loss.

According to an embodiment of the present invention, the method of forming a contact opening with reduced striations and CD loss includes the acts of providing a photosensitive silicone ladder polymer (PVSQ) film over a semiconductor substrate, patterning the PVSQ film employing a photomask with a predefined pattern, exposing the PVSQ film to i-line radiation, developing the exposed PVSQ film in a mixture of anisole/xylene in a ratio of about 1:2 for about 30 seconds, and subsequently annealing the undeveloped PVSQ film at a temperature of about 300° C. to about 600° C. Various integrated circuit structures may be subsequently formed within such contact openings.

These and other features and advantages of the invention will be more clearly apparent from the following detailed description which is provided in connection with accompanying drawings and which illustrates exemplary embodiments of the invention.

DETAILED DESCRIPTION OF THE INVENTION

In the following detailed description, reference is made to various exemplary embodiments for carrying out the invention. These embodiments are described with sufficient detail to enable those skilled in the art to practice the invention, and it is to be understood that other embodiments may be employed, and that structural, electrical and process changes may be made, and equivalents substituted, without departing from the invention. Accordingly, the following detailed description is exemplary and the scope of the present invention is not limited by the detailed description but is defined solely by the appended claims.

The terms "wafer" or "substrate" used in the following description may include any semiconductor-based structure that has a silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions in the base semiconductor or foundation. The following detailed description may not be taken, therefore, in a limiting sense, and the scope of the present invention is defined by the appended claims.

Figure 1:
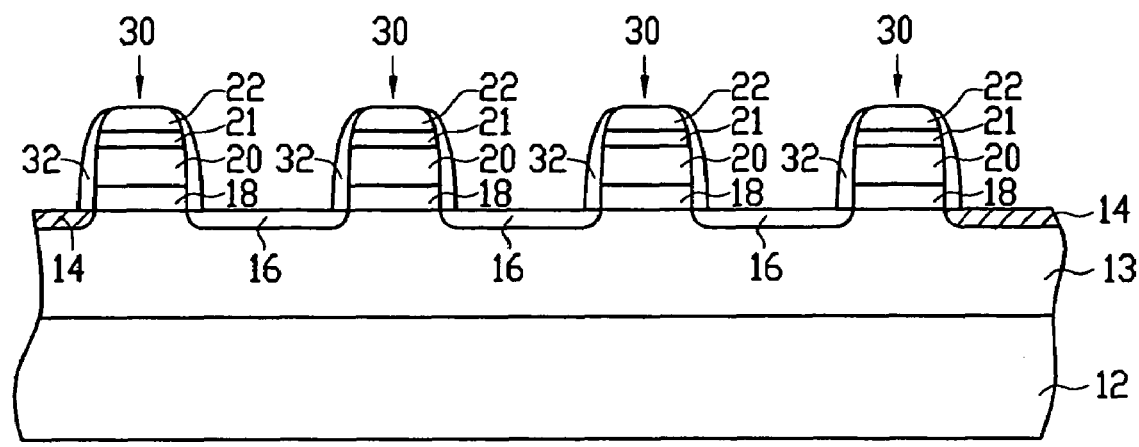
FIG. 1 is a schematic cross-sectional view of a portion of a memory DRAM device, in which contact openings and corresponding integrated circuit structures will be formed according to a method of the present invention

Referring now to the drawings, where like elements are designated by like reference numerals, FIG. 1 depicts a conventional memory cell construction for a DRAM memory 100 (FIG. 12) at an intermediate stage of the fabrication. A pair of memory cells having respective access transistors are formed on a substrate 12 having a well 13, which is typically doped to a predetermined conductivity, e.g. p-type or n-type depending on whether NMOS or PMOS transistors will be formed therein. The structure of FIG. 1 further includes field oxide regions 14, conventional doped active areas 16 for use as source/drain regions, and gate stacks 30, all formed according to well-known semiconductor processing techniques. The gate stacks 30 include an oxide layer 18, a conductive layer 20, such as polysilicon, nitride spacers 32 and a nitride cap 22. A refractory metal silicide layer may also be formed between the conductive layer 20 and the nitride cap 22. Refractory metal silicide layer 21 may be formed of any refractory metal, including but not limited to, titanium, tungsten, tantalum, and molybdenum. Preferably, the refractory metal silicide layer is substantially composed of tungsten silicide ($WSi_x$).

Figure 2:
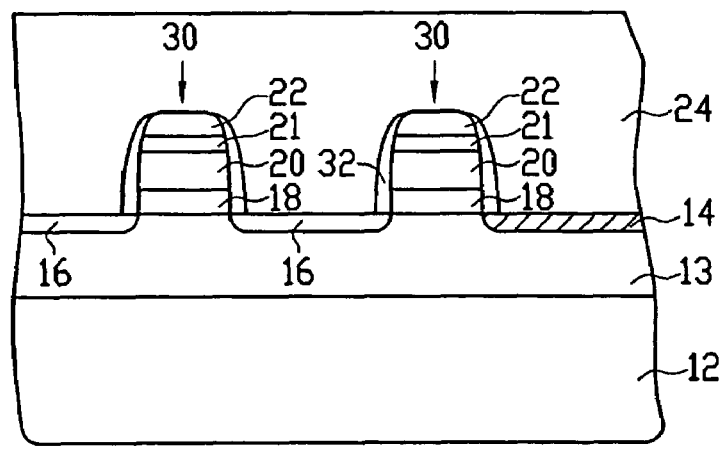
FIG. 2 is a schematic cross-sectional view of a portion of the FIG. 1 device at a stage of processing subsequent to that shown in FIG. 1.

Reference is now made to FIG. 2, which for simplicity illustrates only a lateral portion of FIG. 1, for example, the right side portion of FIG. 1. This is a region where a contact plug and an overlying capacitor structure will be formed in contact openings fabricated in accordance with a method of the present invention. As illustrated in FIG. 2, a first insulating layer 24 is formed above the gate oxide region 18, the polysilicon gates 20, and the protective nitride regions 22, 32.

According to an embodiment of the present invention, the first insulating layer 24 is formed of a photosensitive silicone ladder polymer (PVSQ) film by a method described by Yasuda et al. in *A Novel Photosensitive Silicone Ladder Polymer: Synthesis, Photochemical, and Thermal Characteristics*, 2001 The Chemical Society of Japan, Vol. 74, No. 5, pp. 991-996 (2001), the disclosure of which is incorporated by reference herein. As studied by Yasuda et al., a photosensitive silicone ladder polymer (PVSQ) based on polyphenylsilsesquioxane with vinyl groups as a reactive substituent in the side chains, and 2,6-bis(azidobenzylidene)-4-methylcyclohexanone (BA) as a photocrosslinker reagent, was prepared by copolymerization of trichlorophenylsilane and trichloro (vinyl)silane using potassium hydroxide as a catalyst in isobuthyl methyl ketone (MIBK).

In the experiments conducted by Yasuda et al., the photosensitive silicone ladder polymer (PVSQ) was synthesized in two steps: hydrolysis and condensation of organotrichlorosilane (trichlorophenylsilane and trichloro(vinyl)silane). According to Yasuda et al., the novel photosensitive silicone ladder polymer (PVSQ) exhibited excellent transparency above 280 nm, high solubility in organic solvents, high thermal stability with a decomposition temperature of about 520° C., and a low dielectric constant of about 3.2 at 1 MHz. Yasuda et al. further observed that the vinyl groups on the side chains of the photosensitive silicone ladder polymer (PVSQ) also affected the photosensitivity of the polymer, as did the 2,6-bis(azidobenzylidene)-4-methylcyclohexanone. For example, the photosensitive silicone ladder polymer (PVSQ) exhibited a sensitivity of 40 mJcm$^{-2}$ when exposed to 365 nm light (i-line) followed by development with a mixture solution of anisole and xylene at room temperature.

Figure 4:
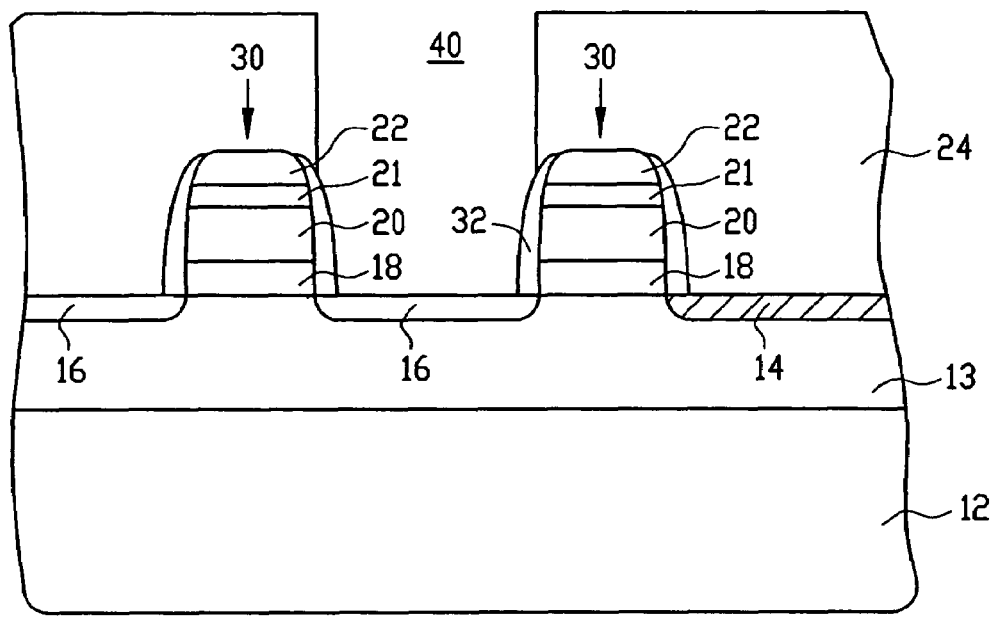
FIG. 4 is a schematic cross-sectional view of a portion of the FIG. 1 device at a stage of processing subsequent to that shown in FIG. 3.

According to an embodiment of the present invention, the first silicone ladder polymer (PVSQ) layer 24 is formed by the method detailed above to a thickness of about 2,000 Angstroms to about 15,000 Angstroms, more preferably of about 6,000 Angstroms to about 10,000 Angstroms. The thickness of the first silicone ladder polymer (PVSQ) layer 24 defines the depth of the contact opening 40 (FIG. 4).

Figure 3:
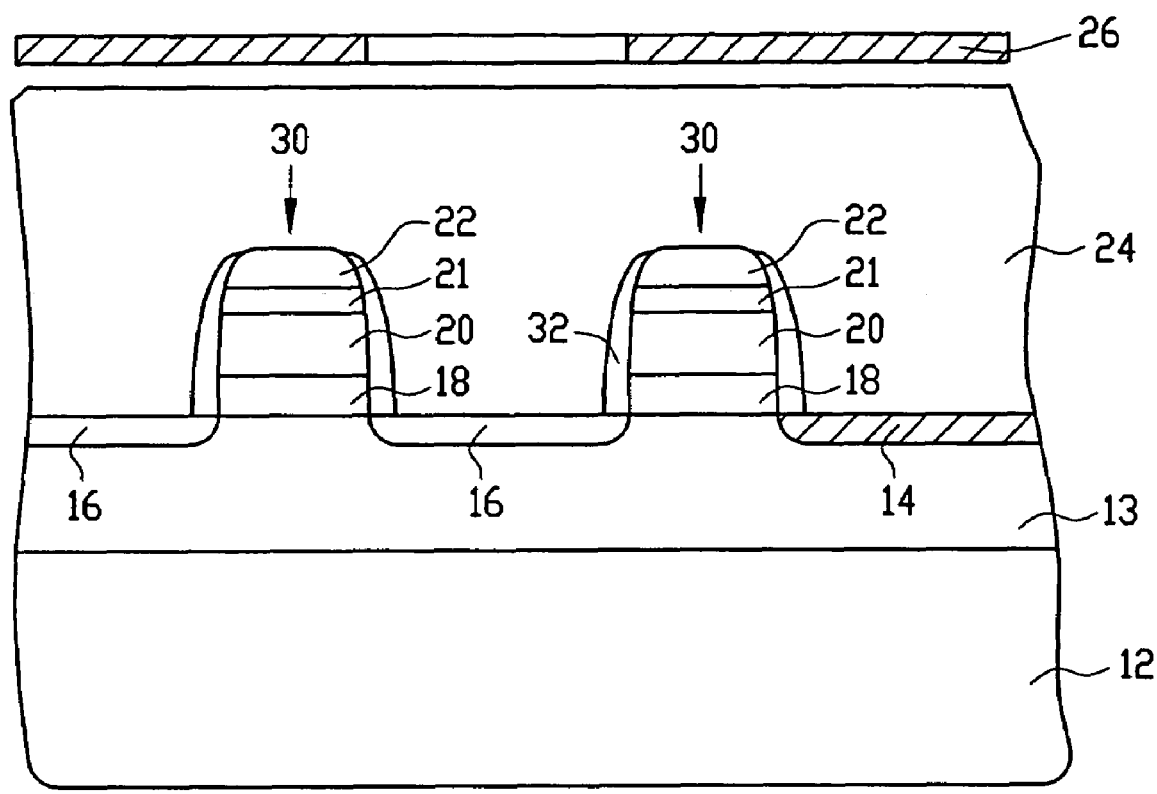
FIG. 3 is a schematic cross-sectional view of a portion of the FIG. 1 device at a stage of processing subsequent to that shown in FIG. 2.

To create a contact opening 40 (FIG. 4) in the first PVSQ insulating layer 24, a photomask 26 (FIG. 3) having a predefined pattern is used for exposing the first PVSQ insulating layer 24 to i-line radiation. After exposure of the first PVSQ insulating layer 24 to i-line radiation through the photomask 26, the structure of FIG. 3 is etched to form a contact opening 40 (FIG. 4) through the first PVSQ insulating layer 24, and the photomask 26 is subsequently removed as shown in FIG. 4.

Since the first PVSQ insulating layer 24 is a photosensitive layer, the need for a photoresist material, which is typically deposited and patterned during the conventional photolithography steps, is eliminated. Accordingly, the first PVSQ insulating layer 24 after exposure is etched directly, without using intermediate processing steps. Because the first PVSQ insulating layer 24 acts as a hard mask in lieu of the photoresist material, the semiconductor substrate 12 need not be exposed to ion and electron bombardment or scattered radiation which characterize typical photolithography and plasma etching processes. Since no plasma etching is necessary as a result of the elimination of the photoresist material, the sidewalls of the contact opening 40 remain smooth and substantially uniform, as they are not attacked during a plasma etching process. This way, no discontinuities or irregularities are formed in the contact opening 40, and the integrated circuit suffers no distorted images and no CD loss.

After exposure through the photomask 26, etching of the first PVSQ insulating layer 24 is conducted by employing a mixture of anisole/xylene in a ratio of about 1:2 as a developer, for about 30 seconds, followed by rinsing with a xylene solution comprising a spin developer for about 30 seconds. This way, the contact opening 40 is etched so that contact opening 40 extends to the source/drain region 16 provided in well the 13 of the substrate 12. Optionally, the remaining undeveloped PVSQ film may be subsequently annealed at a temperature of about 300° C. to about 500° C., more preferably of about 350° C.

Figure 5:
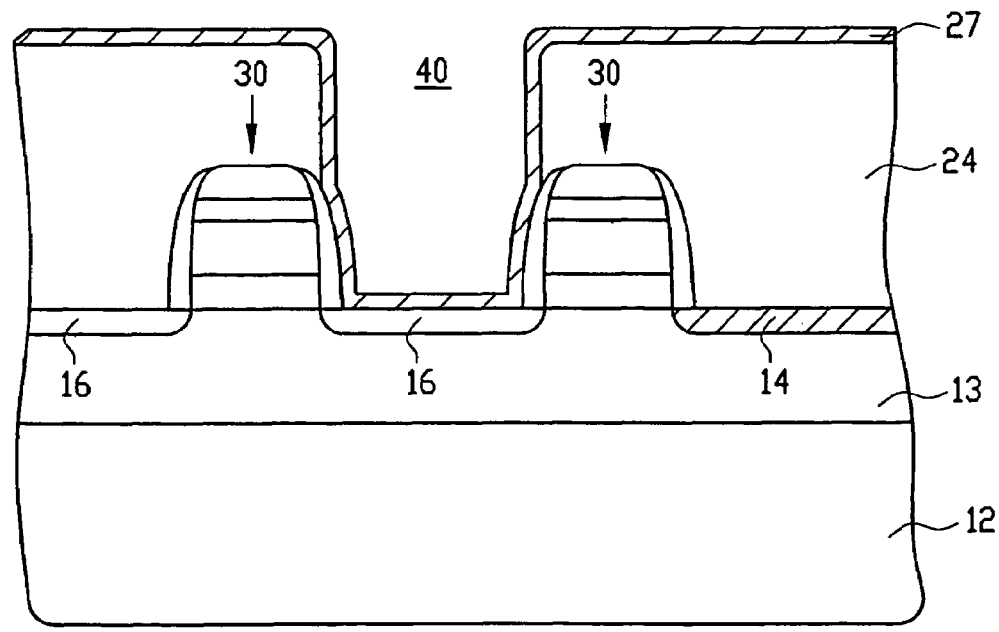
FIG. 5 is a schematic cross-sectional view of a portion of the FIG. 1 device at a stage of processing subsequent to that shown in FIG. 4.

Subsequent to the formation of the contact opening 40 (FIG. 4), a thin diffusion barrier layer 27 may be optionally formed on the bottom and sidewalls of the contact opening 40 and over the first PVSQ insulating layer 24, as shown in FIG. 5. The thin diffusion barrier layer 27 may be formed by using plasma, reactive sputtering or chemical vapor deposition, for example. According to an embodiment of the present invention, the thin diffusion barrier layer 27 is formed of titanium nitride (TiN) to a thickness of about 20 to about 100 Angstroms, more preferably of about 20 to about 50 Angstroms.

Although TiN is an exemplary material for the thin diffusion barrier layer 27, the invention is not limited to these embodiment and other materials may be employed, according primarily to the characteristics of the conductive material which will form conductive plug 50 (FIG. 7), as described in more detail below. For example, if copper is the material of choice for the conductive material forming conductive plug 50 (FIG. 7), then the thin diffusion barrier layer 27 may be formed of titanium-silicon-nitride (Ti—Si—N) by a method described by Min et al. in Metal-organic atomic-layer deposition of titanium-silicon-nitride films, Appl. Phys. Lettrs., Vol. 75, No. 11, pp. 1521-23 (1999), the disclosure of which is incorporated by reference herein.

Min et al. have demonstrated that Ti—Si—N films deposited by an organo-metallic atomic layer deposition (ALD) method prevent the diffusion of copper at temperatures up to 800° C. for about 60 minutes. According to the organo-metallic ALD technique described by Min et al., Ti—Si—N films are deposited at a low temperature of about 180° C. using a sequential supply of Ti[N($CH_3$)$_2$]$_4$ [tetrakis (dimethylamido) titanium: TDMAT], $SiH_4$ (silane) and $NH_3$ (ammonia). While the reactor pressure is maintained at 133 Pa, TDMAT is delivered from the bubbler maintained at 30° C. to the reactor using argon (Ar) (70 sccm) as a carrier gas. The flow rates of $SiH_4$ and $NH_3$ (forming gas with 10% $SiH_4$/90% Ar) diluted in argon are fixed at 70 sccm. The Ti—N—Si films formed by the above-described ALD technique prevent the diffusion of copper at temperatures up to 800° C. for about 60 minutes, and provide a step coverage of about 100%. As the aspect ratio of via/trench increases, maintaining a good step coverage is particularly important for the thin Ti—Si—N diffusion barrier layer 27 deposited on the bottom and the sidewalls of the contact opening 40.

Figure 6:
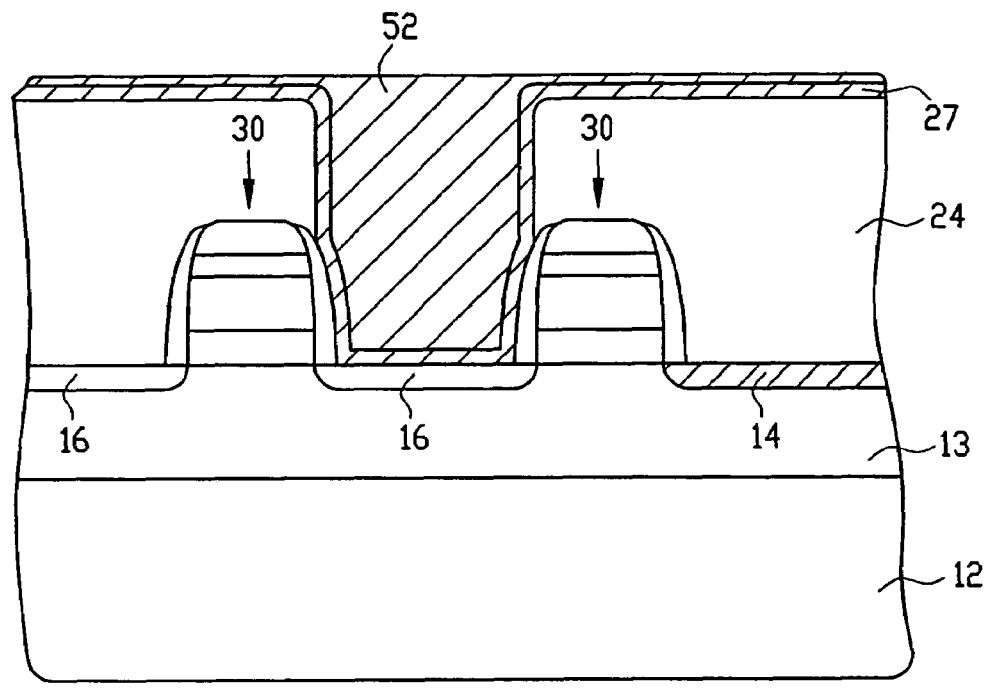
FIG. 6 is a schematic cross-sectional view of a portion of the FIG. 1 device at a stage of processing subsequent to that shown in FIG. 5.
Figure 7:
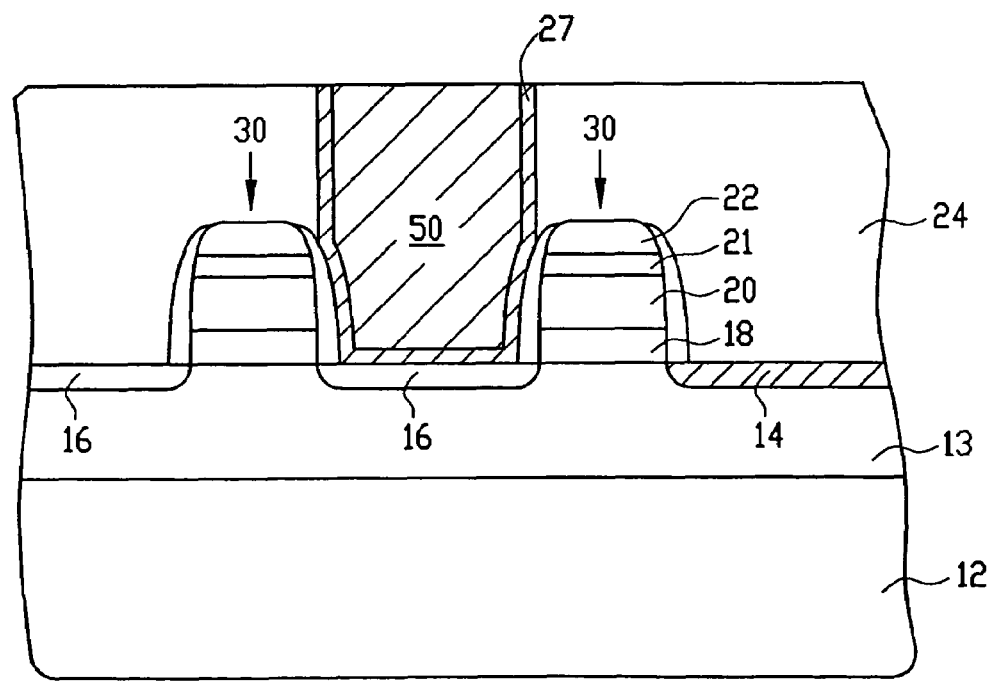
FIG. 7 is a schematic cross-sectional view of a portion of the FIG. 1 device at a stage of processing subsequent to that shown in FIG. 6.

Next, contact opening 40 is filled with a conductive material 52 (FIG. 6), such as doped polysilicon, cobalt, titanium nitride, tungsten, copper or aluminum, among others. After the formation of the thin diffusion barrier layer 27 (FIG. 5) and of the conductive material 52 (FIG. 6), horizontal portions of the barrier material and any excess conductive material formed above the surface of the first PVSQ insulating layer 24 are removed by either an etching or a polishing technique to form conductive structure or plug 50, as illustrated in FIG. 7. In a preferred embodiment of the invention, chemical mechanical polishing is used to polish away excess barrier and conductive material above the first PVSQ insulating layer 24 and the contact opening level. This way, the first PVSQ insulating layer 24 acts as a polishing stop layer when CMP is used.

Figure 8:
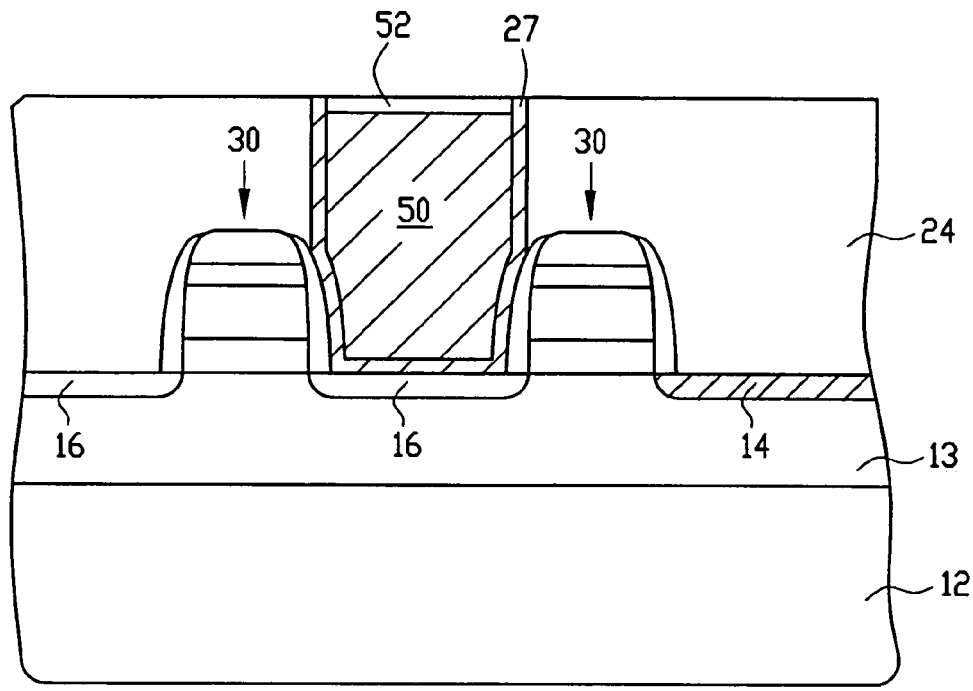
FIG. 8 is a schematic cross-sectional view of a portion of the FIG. 1 device at a stage of processing subsequent to that shown in FIG. 7.

The plug 50 is subsequently anisotropically etched until its top surface is optionally recessed below the planar surface of the first PVSQ insulating layer 24 and of the thin diffusion barrier layer 27, so that a barrier layer 52 (FIG. 8) may be optionally formed, as illustrated in FIG. 8.

The barrier layer 52 (FIG. 8) is formed on the plug 50 by CVD, PVD, sputtering or evaporation, to a thickness of about 60 to about 200 Angstroms. Preferred materials for the barrier layer 52 are refractory metal compounds such as refractory metal nitrides (for example TiN or HfN), refractory metal carbides (for example TiC or WC), or refractory metal borides (for example TiB or MoB). As known in the art, the barrier layer 52 must suppress the diffusion of the silicon or metal atoms from the plug 50, while offering a low resistance and low contact resistance between the metal of the plug 50 and the barrier layer 52, and between the subsequently deposited metal (FIG. 11) and the barrier layer 52.

Figure 9:
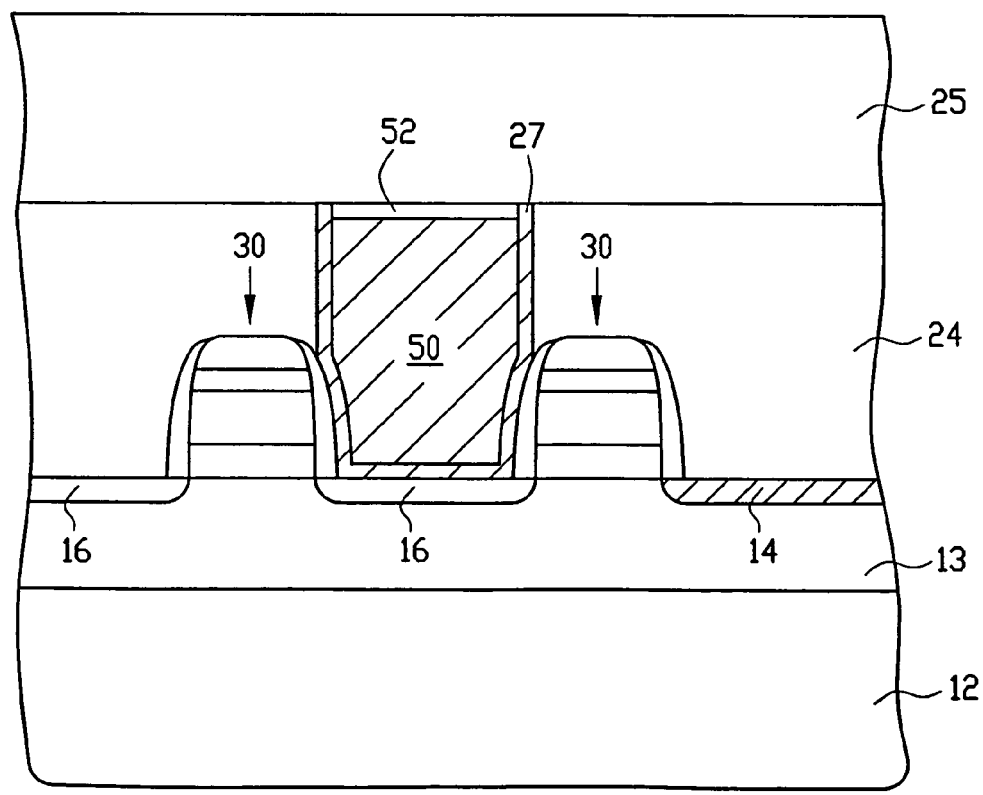
FIG. 9 is a schematic cross-sectional view of a portion of the FIG. 1 device at a stage of processing subsequent to that shown in FIG. 8.

FIG. 9 illustrates the deposition of a second insulating layer 25. According to an embodiment of the present invention, the second insulating layer 25 is formed, for example, of a silicon oxide, borophosphosilicate glass (BPSG), borosilicate glass (BSG), phosphosilicate glass (PSG), or tetraethylortho silicate (TEOS). The second insulating layer 25 may be also formed of a low dielectric constant material such as, for example, polyimide, spin-on-polymers (SOP), parylene, flare, polyarylethers, polytetrafluoroethylene, benzocyclobutene (BCB), SILK, fluorinated silicon oxide (FSG), NANOGLASS or hydrogen silsesquioxane, among others. The present invention is not limited, however, to the above-listed materials and other insulating and/or dielectric materials known in the industry may be used also.

Figure 10:
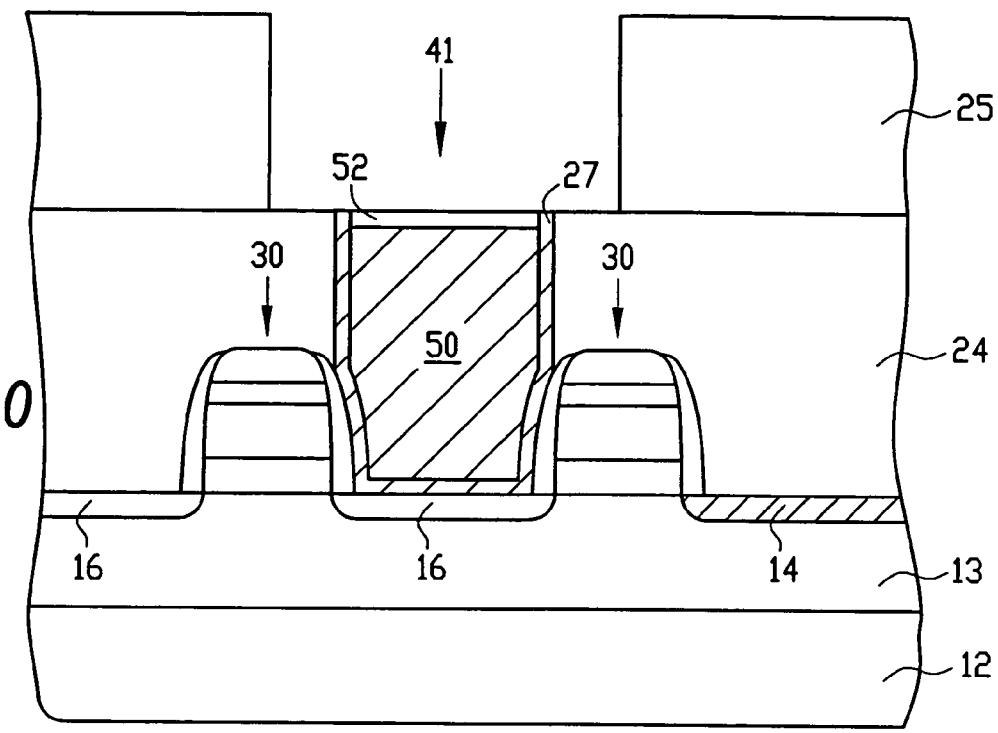
FIG. 10 is a schematic cross-sectional view of a portion of the FIG. 1 device at a stage of processing subsequent to that shown in FIG. 9.

In an exemplary embodiment of the present invention, the second insulating layer 25 is blanket deposited by spin coating to a thickness of about 2,000 Angstroms to 15,000 Angstroms, more preferably of about 6,000 Angstroms to 10,000 Angstroms. The second insulating layer 25 may be cured at a predefined temperature, depending on the nature of the material. Other known deposition methods, such as sputtering by chemical vapor deposition (CVD), plasma enhanced CVD (PECVD), or physical vapor deposition (PVD), may be used also for the formation of the second insulating layer 25, as desired. The thickness of the second insulating layer 25 defines the depth of the contact opening 41 (FIG. 10).

In yet another embodiment of the present invention, the second insulating layer 25 is formed of photosensitive silicone ladder polymer (PVSQ) in a way similar to that described above for the formation of the first PVSQ insulating layer 24 with reference to FIG. 2. If photosensitive silicone ladder polymer (PVSQ) is the material of choice for the formation of the second insulating layer 25, the second insulating layer 25 is formed over the barrier layer 52 and the first PVSQ insulating layer 24 to a thickness of about 2,000 Angstroms to about 15,000 Angstroms, more preferably of about 6,000 Angstroms to about 10,000 Angstroms. Again, using the same technique as the one used for the formation of contact opening 40 (FIG. 4) through the first PVSQ insulating layer 24, a contact opening 41 (FIG. 10) is formed through the second insulating layer 25. The thickness of the second insulating layer 25 defines the depth of the contact opening 41 (FIG. 10).

Figure 11:
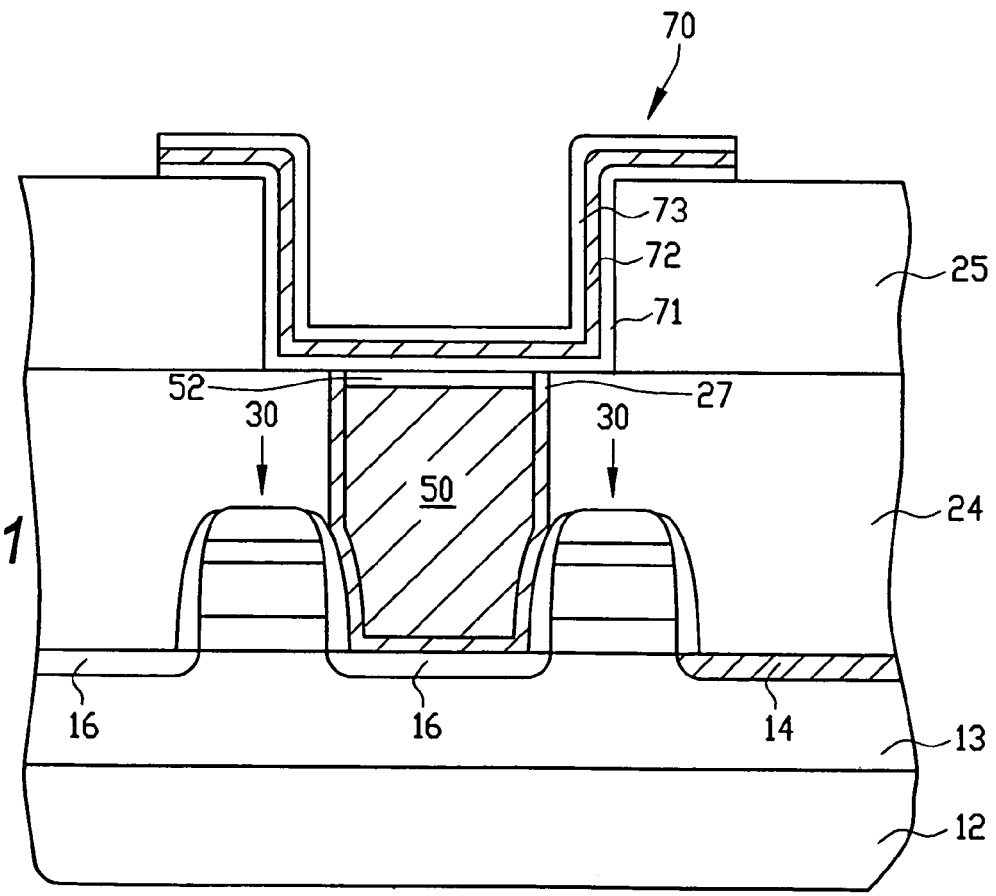
FIG. 11 is a schematic cross-sectional view of the FIG. 1 device at a stage of processing subsequent to that shown in FIG. 10.

Further illustrated in FIG. 11 is an MIM capacitor 70 formed in the contact opening 41 of the second insulating layer 25, which is connected to the active areas 16 by the respective conductive plug 50. The processing steps for the fabrication of the MIM capacitor 70 (FIG. 11) provided in the second insulating layer 25 include a first-level metalization 71, a dielectric film deposition 72, and a second-level metallization 73. As such, a lower capacitor plate 71, also called a bottom or lower electrode is formed during the first-level metallization. The material for the lower capacitor plate 71 may be selected from the group of metals, or metal compositions and alloys, including but not limited to osmium (Os), platinum (Pt), rhodium (Rh), ruthenium (Ru), palladium (Pd), iridium (Ir), and their alloys. The lower capacitor plate 71 could be formed by any conventional method, such as deposition or sputtering, to a thickness of approximately 100 to 300 Angstroms.

Following the first-level deposition, the first level metallization is removed from the top surface regions typically by CMP or dry etch. A high dielectric film 72 (FIG. 11) is formed over the lower capacitor plate 71. The most common high dielectric material used in MIM capacitors is tantalum oxide ($Ta_2O_5$), but other materials such as silicon dioxide ($SiO_2$), silicon nitride ($Si_3N_4$), strontium titanate ($SrTiO_3$), alumina ($Al_2O_3$), barium strontium titanate ($BaSrTiO_3$), or zirconium oxide ($ZrO_2$) may also be used. Further, perovskite oxide dielectric films of the paraelectric type, such as lead titanate ($PbTiO_3$) or lead zirconite ($PbZrO_3$), are also good candidates for high dielectric film materials even if their dielectric constant is slightly lower than that of the above mentioned dielectrics. As known in the art, the thickness of the high dielectric film 72 determines the capacitance per unit area of the MIM capacitor 70.

After the formation of the dielectric film 72 (FIG. 11), a second-level metallization is conducted to form an upper capacitor plate 73, also called a top or upper electrode, by a method similar to or different from that employed for the formation of the lower capacitor plate 71. The material for the upper capacitor plate 73 may be selected from the group of metals, or metal compositions and alloys, including but not limited to osmium (Os), platinum (Pt), rhodium (Rh), ruthenium (Ru), palladium (Pd), iridium (Ir), and their alloys. The upper capacitor plate could be formed by any conventional method, such as deposition or sputtering, to a thickness of approximately 100 to 300 Angstroms. After the dielectric film 72 and the upper capacitor plate 73 are formed, they are etched patterned.

Figure 12:
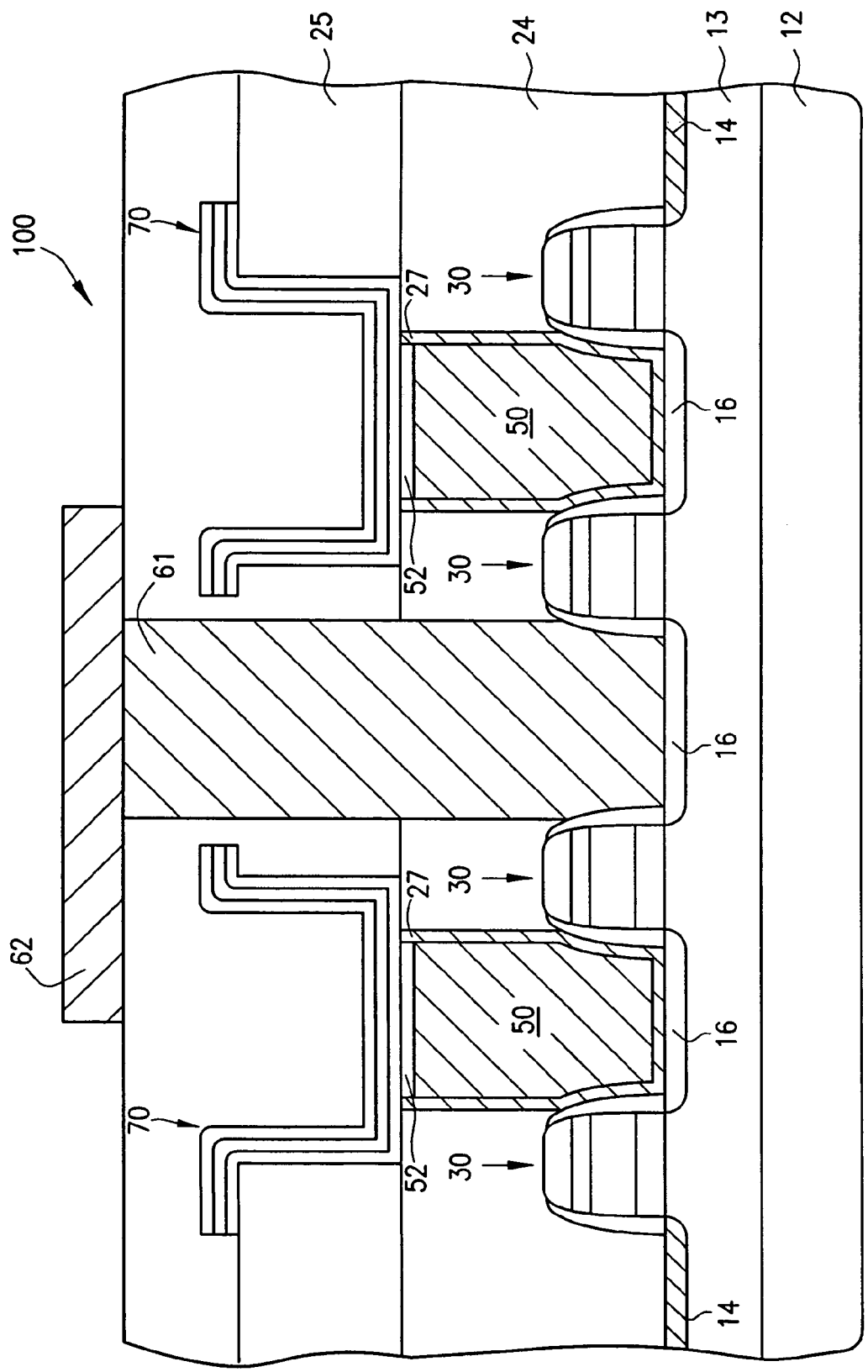
FIG. 12 is a schematic cross-sectional view of the FIG. 1 device at a stage of processing subsequent to that shown in FIG. 11.

FIG. 12 illustrates the DRAM memory cell 100 with two MIM capacitors 70 which are connected to respective active areas 16 by the respective polysilicon plugs 50. The DRAM memory cell 100 also includes a bit line contact 62, which is further connected to the common active areas 16 of the access transistors by another conductive plug 61. The bit line contact 62 may be formed in two parts, one in each of the photosensitive silicone ladder polymer (PVSQ) layer 24 and of the second insulating layer 25. The bit line contact 62 may be also formed, however, as a single plug through both the photosensitive silicone ladder polymer (PVSQ) layer 24 and the second insulating layer 25. The access transistors respectively write and read charge from capacitor 70, from and to the bit line contact 62.

Figure 13:
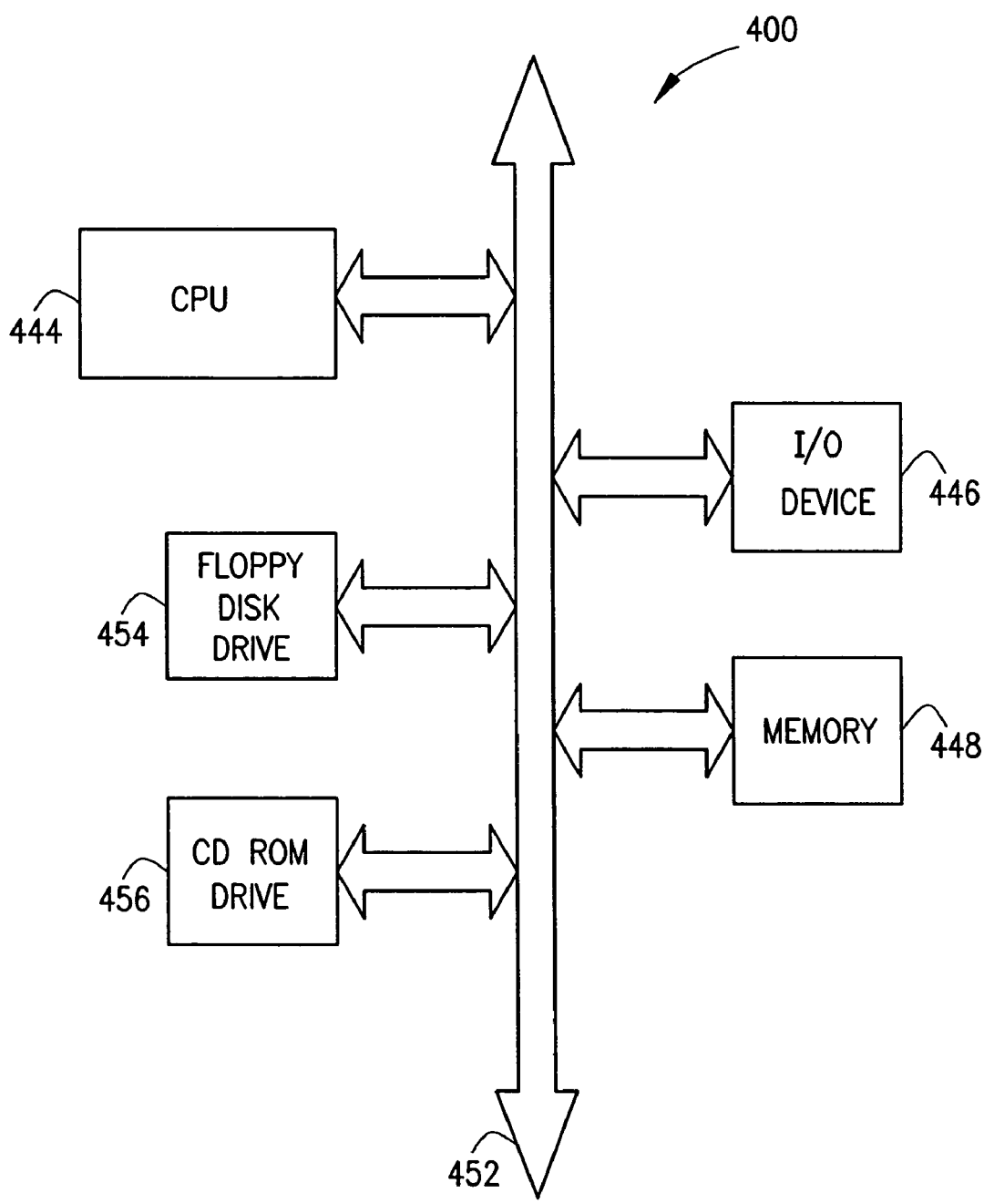
FIG. 13 is an illustration of a computer system having a memory device with integrated circuit structures constructed within contact openings formed according to the present invention.

The structures of FIGS. 11-12 formed within the photosensitive silicone ladder polymer (PVSQ) layer 24 and the second insulating layer 25 which, as explained above, may also be formed of photosensitive silicone ladder polymer (PVSQ), could further be part of any integrated circuit structure, such as an integrated circuit used in the processor-based system 400 illustrated in FIG. 13. The processor-based system 400 includes a memory circuit 448, for example a DRAM memory, a SRAM memory, a flash memory, a Multi Chip Module (MCM), or a memory module containing one or more DRAM memory devices 100, at least one having at least one of a conductive plug and a capacitor formed in a photosensitive silicone ladder polymer (PVSQ) insulating layer in accordance with the invention. A processor system, which may be a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452 directly or though a memory controller.

Although the exemplary embodiments of the present invention have been described with reference to the formation of the conductive plug 50 and of the MIM capacitor 70 formed within the respective contact openings 40 (FIG. 4) and 41 (FIG. 10) formed within the photosensitive silicone ladder polymer (PVSQ) layer 24 and the second insulating layer 25 which, as explained above, may be optionally formed of photosensitive silicone ladder polymer (PVSQ), the invention is not limited to these embodiments. Thus, the invention also applies to the formation of the conductive plug 61 (FIG. 12) formed within a contact opening (not shown) which is also formed within the photosensitive silicone ladder polymer (PVSQ) layer 24 and the second insulating layer 25 which, as explained above, could optionally be a photosensitive silicone ladder polymer (PVSQ).

Although the exemplary embodiments of the present invention have been described with reference to the formation of the contact opening 40 through the photosensitive silicone ladder polymer (PVSQ) layer 24 and of the contact opening 41 through a second insulating layer 25 which could optionally be a photosensitive silicone ladder polymer, the invention is not limited to these embodiments. Accordingly, the invention also contemplates the formation of the contact opening 40 through an insulating material other than photosensitive silicone ladder polymer and the formation of the contact opening 41 through a photosensitive silicone ladder polymer (PVSQ) layer.

Although the present invention has been described above with reference to an MIM capacitor, such as the MIM capacitor 70 of FIG. 11, the invention is not limited to MIM capacitors. Accordingly, the present invention contemplates the formation of other types of capacitors, as long as these capacitors are formed in the second insulating layer 25 which, as described above, may optionally comprise photosensitive silicone ladder polymer (PVSQ). For example, the invention contemplates the formation of conventional container capacitors or MIS capacitors, or SIS capacitors, among others.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A processor-based system comprising:
   a processor; and
   an integrated circuit coupled to said processor, at least one of said integrated circuit and said processor comprising a photosensitive silicone ladder polymer layer formed over a substrate, an opening formed in said photosensitive silicone ladder polymer layer, a diffusion barrier layer formed along a bottom and sidewalls of said opening, a conductive plug formed over said diffusion barrier layer, said diffusion barrier layer being in contact with a spacer of a first transistor and a spacer of a second transistor, and a capacitor electrically coupled to said conductive plug.

2. The processor-based system of claim 1, wherein said integrated circuit is a memory device.

3. The processor-based system of claim 2, wherein said memory device is a DRAM memory device.

4. The processor-based system of claim 2, wherein said memory device is a SRAM memory device.

5. The processor-based system of claim 2, wherein said memory device is a flash memory device.

6. The processor-based system of claim 2, wherein said capacitor is formed in an insulating photosensitive silicone ladder polymer layer.

7. The processor-based system of claim 1, wherein said diffusion barrier layer comprises at least one of titanium nitride and titanium-silicon-nitride.

8. The processor-based system of claim 1, further comprising a barrier layer formed over and in contact with said conductive plug, said barrier layer being formed in said opening and comprising at least one of refractory metal nitrides, refractory metal carbides, and refractory metal borides.

9. The processor-based system of claim 1, further comprising:

an insulating material formed over said photosensitive silicone ladder polymer layer; and a second conductive plug formed in said insulating material and said photosensitive silicone ladder polymer layer.

10. The processor-based system of claim 1, wherein said capacitor is an MIM capacitor.

11. The processor-based system of claim 1, wherein said capacitor is an MIS capacitor.

12. The processor-based system of claim 1, wherein said capacitor is an SIS capacitor.

13. The processor-based system of claim 1, wherein said photosensitive silicone ladder polymer layer has a thickness of about 2,000 Angstroms to about 15,000 Angstroms.

14. The processor-based system of claim 13, wherein said photosensitive silicone ladder polymer layer has a thickness of about 6,000 Angstroms to about 10,000 Angstroms.

* * * * *